(12) United States Patent
Baba et al.

(10) Patent No.: US 10,295,607 B2
(45) Date of Patent: May 21, 2019

(54) DEVICE FOR ESTIMATING PARAMETERS OF BATTERY, AND ESTIMATION METHOD

(71) Applicants: CALSONIC KANSEI CORPORATION, Saitama-shi, Saitama (JP); KEIO UNIVERSITY, Minato-ku, Tokyo (JP); KYOTO UNIVERSITY, Kyoto-shi, Kyoto (JP)

(72) Inventors: Atsushi Baba, Saitama (JP); Shuichi Adachi, Yokohama (JP); Ichiro Maruta, Kyoto (JP)

(73) Assignees: CALSONIC KANSEI CORPORATION, Saitama-shi, Saitama (JP); KEIO UNIVERSITY, Minato-ku, Tokyo (JP); KYOTO UNIVERSITY, Kyoto-shi, Kyoto (JP)

( * ) Notice: Subject to any disclaimer, the term of this patent is extended or adjusted under 35 U.S.C. 154(b) by 309 days.

(21) Appl. No.: 14/433,139

(22) PCT Filed: Sep. 27, 2013

(86) PCT No.: PCT/JP2013/005793
§ 371 (c)(1),
(2) Date: Apr. 2, 2015

(87) PCT Pub. No.: WO2014/054259
PCT Pub. Date: Apr. 10, 2014

(65) Prior Publication Data
US 2015/0260800 A1     Sep. 17, 2015

(30) Foreign Application Priority Data

Oct. 5, 2012 (JP) .................................. 2012-223002

(51) Int. Cl.
*G01R 31/36* (2019.01)
*G01R 31/392* (2019.01)
(Continued)

(52) U.S. Cl.
CPC ......... *G01R 31/392* (2019.01); *G01R 31/367* (2019.01); *G01R 31/3648* (2013.01);
(Continued)

(58) Field of Classification Search
CPC ............ G01R 31/3679; G01R 31/3606; G01R 31/3648; G01R 31/3651; G01R 31/3624; H01M 10/48; H02J 7/0047
See application file for complete search history.

(56) References Cited

U.S. PATENT DOCUMENTS

| 6,232,744 B1 * | 5/2001 | Kawai | ..................... B60K 6/28 180/65.235 |
| 2009/0228225 A1 * | 9/2009 | Burgess | ............. G01R 31/3651 702/63 |

(Continued)

FOREIGN PATENT DOCUMENTS

| JP | 2010135075 A | 6/2010 |
| JP | 2012047580 A | 3/2012 |

OTHER PUBLICATIONS

Dec. 17, 2013 International Search Report issued in International Patent Application No. PCT/JP2013/005793.
(Continued)

*Primary Examiner* — Khamdan N. Alrobaie
(74) *Attorney, Agent, or Firm* — Kenja IP Law PC (57) ABSTRACT

A device for estimating parameters of battery capable of improving, by using simple calculations, estimation accuracy of a parameter and the like of a battery equivalent circuit model will be provided.
The device for estimating parameters of battery for estimating the parameter of a battery (1) includes: a battery equivalent circuit model (4A) including resistance and a capacitor as the parameter; a logarithmic conversion parameter value estimation unit (4B) for sequentially estimating, by using a logarithmic conversion parameter value serving as a state
(Continued)

variable obtained by carrying out logarithmic conversion on the parameter, the logarithmic conversion parameter value with a Kalman filter (41) from a state equation and an output equation, based on a charging/discharging current and a terminal voltage those being detected; and an inverse logarithmic conversion unit (4C) for obtaining, from the logarithmic conversion parameter value, an estimated parameter value serving as an antilogarithm corresponding to the logarithmic conversion parameter value.

6 Claims, 9 Drawing Sheets

(51) Int. Cl.
    *G01R 31/367*     (2019.01)
    *G01R 31/382*     (2019.01)
    *H01M 10/48*     (2006.01)
    *G01R 31/3842*     (2019.01)
    *H02J 7/00*     (2006.01)

(52) U.S. Cl.
    CPC .......... *G01R 31/382* (2019.01); *H01M 10/48* (2013.01); *G01R 31/3842* (2019.01); *H02J 7/0047* (2013.01)

(56) References Cited

U.S. PATENT DOCUMENTS

| | | | |
|---|---|---|---|
| 2012/0041698 A1* | 2/2012 | Zhang | G01R 31/367 702/63 |
| 2013/0154577 A1* | 6/2013 | Iwane | H02J 7/045 320/162 |
| 2013/0169281 A1* | 7/2013 | Baba | G01R 31/382 324/426 |
| 2013/0297243 A1* | 11/2013 | Baba | B60L 11/1861 702/63 |
| 2015/0127280 A1* | 5/2015 | Baba | H01M 10/48 702/63 |
| 2016/0105042 A1* | 4/2016 | Taylor | H01M 10/128 320/134 |
| 2016/0252585 A1* | 9/2016 | Baba | H01M 10/48 702/63 |

OTHER PUBLICATIONS

"Model prediction control" Jan M. Maciejowski, translated by Shuichi Adachi and Masaaki Kanno, published on Jan. 20, 2005 by Tokyo Denki University Press, pp. 72-73.

Jun. 27, 2016, Office Action issued by the State Intellectual Property Office in the corresponding Chinese Patent Application No. 201380052378.X with English language concise explanation of the relevance.

\* cited by examiner

DEVICE FOR ESTIMATING PARAMETERS OF BATTERY, AND ESTIMATION METHOD

CROSS REFERENCE TO RELATED APPLICATION

This application claims priority to and the benefit of Japanese Patent Application No. 2012-223002 (filed on Oct. 5, 2012), the entire contents of which are incorporated herein by reference.

TECHNICAL FIELD

The present invention relates to a device for estimating parameters of battery (a battery parameter estimation device) capable of sequentially estimating a parameter of a battery equivalent circuit model by using a Kalman filter, and also to an estimation method of the battery parameter estimation device.

BACKGROUND

An estimation device described in Patent Document 1 set forth below is known as a conventional estimation device for estimating an internal state, a parameter and the like of a battery.

This estimation device for estimating the parameter and the like of the battery detects a charging/discharging current and a terminal voltage of the battery and, based on inputs thereof, sequentially estimates the parameter and an open-circuit voltage with a Kalman filter by using a battery equivalent circuit model. A correction state of charge is estimated from the open-circuit voltage and, based on the correction state of charge, the charging/discharging current is corrected. A corrected charging/discharging current is integrated, and a value thus obtained is divided by a full charge capacity value. Thereby, a state of charge (SOC: State of Charge) of the battery is obtained more accurately.

Estimation of the parameter of the battery equivalent circuit model and the open-circuit voltage by the Kalman filter as described above so as to estimate the internal state of the battery such as the SOC and a state of health (SOH: State of Health) has been widely carried out by conventional techniques in addition to the Patent Document 1.

In this case, as disclosed in Non Patent Document 1 set forth below, for example, when a state equation and an output equation of a target system are affected by disturbance of white noise having a known covariance matrix, a gain matrix that minimizes a mean square state error may be selected. The Kalman filter is known as an observing device used for this purpose.

In other words, the Kalman filter may carry out an optimal prediction when it may be assumed that future values of the disturbance and the noise are equal to their mean values (i.e., zero).

CITATION LIST

Patent Document

Patent Document 1: Japanese Patent Application Laid-Open Publication No. 2012-47580

Non-Patent Document

Non-Patent Document 1: "Model prediction control" Jan M. Maciejowski, translated by Shuichi Adachi and Masaaki Kanno, published on Jan. 20, 2005 by Tokyo Denki University Press, pp. 72-73

However, the conventional estimation devices for estimating the parameter and the like of the battery as described above have a problem as described below.

That is, the estimation devices for estimating the parameter and the like of the battery with the Kalman filter that have been conventionally suggested, including the conventional estimation device as described above, consider that the noise of the parameter (a resistor and a capacitor) is the white noise as described above and these parameter thus form a normal distribution.

Even when the parameter was estimated based on the assumption that the noise of the parameter is the white noise and the parameter form the normal distribution, the parameter was estimated with some accuracy.

However, the present inventors, through their experiments and measurements, found that a value estimated by the above conventional method may significantly deviate from an actual value and, for example, the parameter such as a resistance value possibly takes an unpractical negative value.

This may be because of complex chemical reactions of battery operations which causes the deviation of the estimation value in a simplified circuit equivalent model.

However, an equivalent circuit model having more resistors and capacitors carries out complicated operations and thus has extreme difficulty to be used for actual processing.

An object of the present invention, in view of the above problems, is to provide a battery parameter estimation device that, in estimating the parameter of the battery equivalent circuit model, may improve estimation accuracy of the parameter by using a simple calculation and obtain the parameter approximate to an actual value, and also to provide an estimation method of the battery parameter estimation device.

SUMMARY

In order to achieve the above object, a device for estimating parameters of battery according to the first aspect of the present invention including a charging/discharging current detection unit for detecting a charging/discharging current of a battery, a terminal voltage detection unit for detecting a terminal voltage of the battery, and a battery equivalent circuit model including a resistor and a capacitor as a parameter, the device for estimating parameters of battery estimating the parameter by using the battery equivalent circuit model based on the charging/discharging current detected by the charging/discharging current detection unit and the terminal voltage detected by the terminal voltage detection unit, the device for estimating parameters of battery includes:

a logarithmic conversion parameter value estimation unit for sequentially estimating, by using a logarithmic conversion parameter value serving as a state variable obtained by carrying out logarithmic conversion on the parameter, the logarithmic conversion parameter value with a Kalman filter from a state equation and an output equation, based on the charging/discharging current and the terminal voltage those being detected; and an inverse logarithmic conversion unit for obtaining, by carrying out inverse logarithmic conversion on the logarithmic conversion parameter value, an estimated parameter value serving as an antilogarithm corresponding to the logarithmic conversion parameter value.

A device for estimating parameters of battery according to the second aspect of the present invention is the device for estimating parameters of battery according to the first aspect of the present invention, including:

an internal state value estimation unit for estimating an internal state value of the battery based on the parameter serving as the antilogarithm obtained by the inverse logarithmic conversion unit.

A device for estimating parameters of battery according to the third aspect of the present invention is the device for estimating parameters of battery according to the second aspect of the present invention, wherein the internal state value is at least one of a state of charge and a state of health of the battery.

An estimation method of a battery parameter according to the fourth aspect of the present invention is an estimation method the battery parameter for detecting a charging/discharging current and a terminal voltage of a battery and, based on the charging/discharging current and the terminal voltage those being detected, estimating a parameter by using an equivalent circuit model including a resistor and a capacitor serving as the parameter, the estimation method includes:

sequentially estimating, by using a logarithmic conversion parameter value serving as a state variable obtained by carrying out logarithmic conversion on the parameter, the logarithmic conversion parameter value with a Kalman filter from a state equation and an output equation, based on the charging/discharging current and the terminal voltage those being detected; and obtaining an estimated parameter value serving as an antilogarithm corresponding to the logarithmic conversion parameter value by carrying out inverse logarithmic conversion on the logarithmic conversion parameter value.

An estimation method of a battery parameter according to the fifth aspect of the present invention is the estimation method of the battery parameter according to the fourth aspect, wherein an internal state value of the battery is estimated based on the parameter serving as the antilogarithm obtained by carrying out the inverse logarithmic conversion.

An estimation method of a battery parameter according to the sixth aspect of the present invention is the estimation method of the battery parameter according to the fifth aspect, wherein the internal state value is at least one of a state of charge and a state of health of the battery.

According to the device for estimating parameters of battery of the first aspect of the present invention, the logarithmic conversion parameter estimation unit carries out the logarithmic conversion on the parameter of the battery equivalent circuit model and thus obtains the logarithmic conversion parameter value serving as the state value, and then sequentially estimates the logarithmic conversion parameter value with the Kalman filter based on the charging/discharging current and the terminal voltage. The inverse logarithmic conversion unit carries out the inverse logarithmic conversion on the logarithmic conversion parameter value estimated and thus obtains the parameter serving as the antilogarithm, which is considered as an estimated parameter value.

Therefore, an accuracy of the parameter estimation of the battery equivalent circuit model may be improved. Also, the parameter may be prevented from taking an unpractical negative value.

According to a device for estimating parameters of battery of the second aspect of the present invention, the internal state of the battery may also be estimated highly accurately.

According to a device for estimating parameters of battery of the third aspect of the present invention, the state of charge and the state of health may be estimated highly accurately.

According the estimation method of the parameter of the battery of the fourth aspect of the present invention, the logarithmic conversion parameter value serving as the state variable is obtained by carrying out the logarithmic conversion on the parameter of the battery equivalent circuit model and sequentially estimated by the Kalman filter based on the charging/discharging current and the terminal voltage. The estimated value is subjected to the inverse logarithmic conversion so as to obtain the parameter serving as the antilogarithm, which is considered as the estimated parameter value.

Therefore, the accuracy of the parameter estimation of the battery equivalent circuit model may be improved. Also, the parameter may be prevented from taking an unpractical negative value.

According to the estimation method of the battery parameter of the fifth aspect of the present invention, the internal state of the battery may also be estimated highly accurately.

According to the estimation method of the battery parameter of the sixth aspect of the present invention, the state of charge and the state of health may be estimated highly accurately.

DETAILED DESCRIPTION

Hereinafter, an embodiment of the present invention will be described in detail based on examples illustrated in drawings.

Embodiment 1

Hereinafter, a battery parameter estimation device according to Embodiment 1 will be described with reference to the accompanying drawings.

The battery parameter estimation device according to Embodiment 1 is used for vehicles such as an electric vehicle, a hybrid electric vehicle, and the like. These vehicles include: an electric motor for driving the vehicle; a battery; and a controller for controlling power supply (discharge) to the electric motor, regeneration of braking energy from the electric motor during braking, and power recovery (charging) to the battery from an offboard charging equipment.

A charging/discharging current flown to/from the battery changes an internal state of the battery. Therefore, the internal state is monitored and estimated by the battery parameter estimation device. Thereby, necessary information such as a remaining battery level is obtained.

Figure 1:
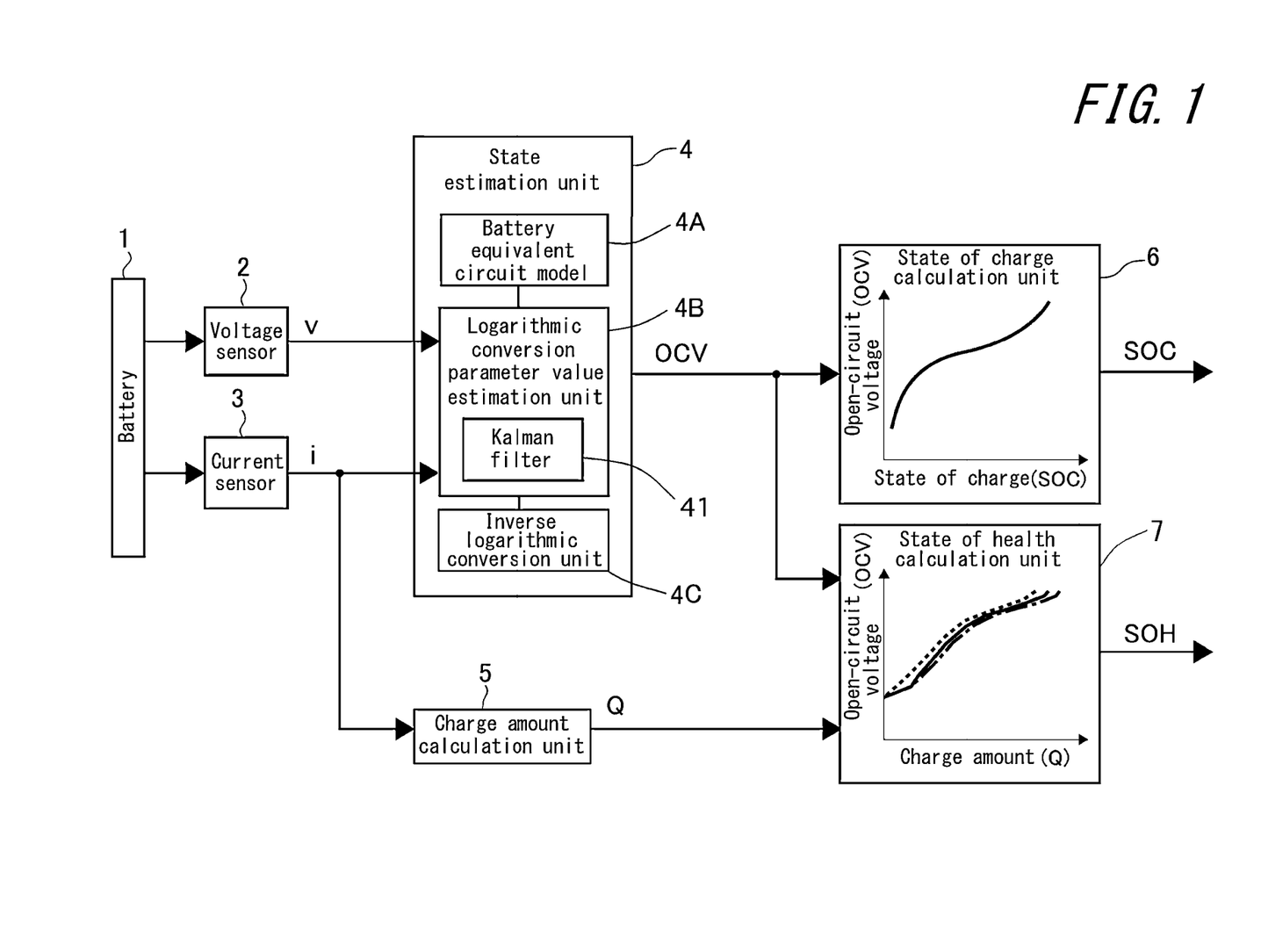
FIG. 1 is a diagram illustrating a functional block of a battery parameter estimation device connected to a battery according to one embodiment of the present invention.

As illustrated in FIG. 1, the battery parameter estimation device for estimating the parameter and the like of a battery 1 includes a voltage sensor 2 and a current sensor 3 those connected to the battery 1, a state estimation unit 4, a charge amount calculation unit 5, a state of charge calculation unit 6, and a state of health calculation unit 7.

Note that a micro-computer mounted on the vehicle functions as the state estimation unit 4, the charge amount calculation unit 5, the state of charge calculation unit 6, and the state of health calculation unit 7.

The battery 1 according to the present embodiment is a rechargeable battery (secondary battery) such as, for example, a lithium ion battery but not limited thereto. Other batteries such as a nickel-metal hydride battery and the like may be used, as a matter of course.

The voltage sensor 2 detects a voltage between terminals of the battery 1, and a terminal voltage value v thus detected is input to the state estimation unit 4.

The voltage sensor 2 corresponds to a terminal voltage detection unit of the present invention.

The current sensor 3 detects an amount of a discharging current for supplying power from the battery 1 to the electric motor and the like, as well as an amount of a charging current obtained by collecting braking energy by using the electric motor serving as a generator during braking or obtained by charging from the offboard charging equipment.

A charging/discharging current value i thus detected is output as an input signal to the state estimation unit 4.

The current sensor 3 corresponds to the charging/discharging current detection unit of the present invention.

The state estimation unit 4 includes a battery equivalent circuit model 4A of the battery 1, a logarithmic conversion parameter value estimation unit 4B, and an inverse logarithmic conversion unit 4C.

The battery equivalent circuit model 4A is formed by a Foster type RC ladder circuit represented by an approximation by a sum of infinite series of a parallel circuit of a resistor and a capacitor connected thereto, or a Cauer type RC ladder circuit represented by an approximation by continued fraction expansion of a capacitor connected to the ground between the resistors connected in series. Note that the resistor and the capacitor serve as the parameter of the battery equivalent circuit model 4A.

The logarithmic conversion parameter value estimation unit 4B includes a Kalman filter 41 and obtains a logarithmic conversion parameter value serving as a state variable by carrying out logarithmic conversion on the parameter. Then, the logarithmic conversion parameter value estimation unit 4B, by using the battery equivalent circuit model 4A, sequentially estimates the logarithmic conversion parameter value obtained as described above and an open-circuit voltage of the battery 1, based on the terminal voltage v obtained from the voltage sensor 2 and the charging/discharging current i obtained from the current sensor 3. In this estimation, that is, the parameter of the battery equivalent circuit model 4A is subjected to the logarithmic conversion, and the logarithmic conversion parameter value thus obtained serving as the state variable is calculated from the state equation and the output equation.

The open-circuit voltage (OCV: Open Circuit Voltage) estimated by the logarithmic conversion parameter value estimation unit 4B is output to the state of charge calculation unit 6 and the state of health calculation unit 7.

Note that the Kalman filter 41 includes a design of a model of a target system (the battery equivalent circuit model 4A in the present embodiment), inputs the same input signal to the model and an actual system, and compares outputs thereof. When there is an error between them, the error is multiplied by a Kalman gain and then fed back to the model. Thereby, the model is corrected to minimize the error between the output of the model and the output of the system. The Kalman filter 41 repeats this operation so as to estimate the parameter of the model.

The logarithmic conversion parameter value of the battery equivalent circuit model 4A obtained by the logarithmic conversion parameter value estimation unit 4B is input to the inverse logarithmic conversion unit 4C. The logarithmic conversion parameter value is then subjected to inverse logarithmic conversion, whereby a parameter serving as an antilogarithm corresponding to the logarithmic conversion parameter value is obtained.

Note that the battery equivalent circuit model 4A, the logarithmic conversion parameter value estimation unit 4B, and the inverse logarithmic conversion unit 4C of the state estimation unit 4 will be described in detail later.

The charging/discharging current value i of the battery 1 detected by the current sensor 3 is input to the charge amount calculation unit 5. The charging/discharging current value i is sequentially integrated, whereby a charging/discharging amount flowing to/from the battery 1 is obtained, which is then subtracted from a remaining charging amount stored prior to the sequential integrating calculation. Thereby, a charge amount Q currently held by the battery 1 is calculated. The charge amount Q is output to the state of health calculation unit 7.

Since the relation between the open-circuit voltage value and the state of charge is unlikely to be affected by deterioration of the battery 1, the state of charge calculation unit 6 stores relation data such as a characteristic table, for example, obtained through preliminary experiments and the like of the relation. Based on the characteristic table, the state of charge calculation unit 6 estimates the state of charge at the time from an open-circuit voltage estimation value estimated by the state estimation unit 4. The state of charge thus estimated is used to manage the battery 1.

The state of health calculation unit 7 includes a characteristic table showing a relation between the charge amount Q and the open-circuit voltage OCV for each state of health SOH classified into predetermined ranges. Details of the characteristic table is disclosed in, for example, Japanese Patent Application Laid-Open Publication No. 2012-57956 filed by the present applicant.

The open-circuit voltage estimation value estimated by the state estimation unit 4 and the charge amount calculated by the charge amount calculation unit 5 are input to the state of health calculation unit 7. The state of health calculation unit 7 calculates to determine the range of the state of health SOH into which the open-circuit voltage estimation value and the charge amount are classified, and a corresponding state of health SOH is output.

The following is a detailed description of the state estimation unit 4 of the battery parameter estimation device as described above.

First, the battery equivalent circuit model 4A will be described.

Figure 2:
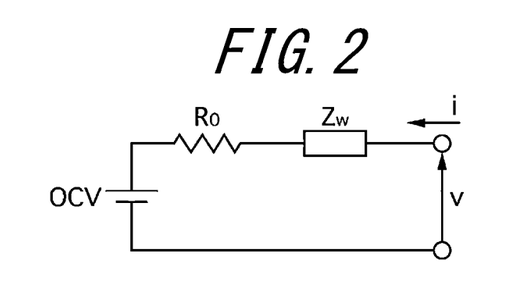
FIG. 2 is a diagram illustrating a battery equivalent circuit model.

A battery model to be estimated is illustrated in FIG. 2.

Figure 3:
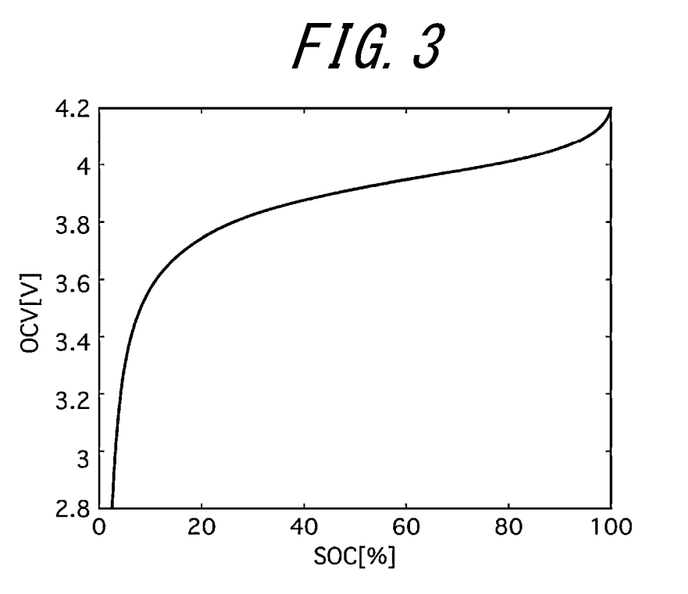
FIG. 3 is a diagram illustrating a relation between an open-circuit voltage and a state of charge of the battery.

This model includes the open-circuit voltage OCV, the resistance $R_0$, and Warburg impedance $Z_w$. The OCV is represented by a nonlinear function of the SOC as illustrated in FIG. 3.

The SOC has a relation with the current i and a full charge capacity (FCC: Full Charge Capacity) that satisfies:

[Equation 1]

$$\frac{d}{dt}SOC = \frac{i}{FCC} \quad (1)$$

Note that the Warburg impedance $Z_w$ is impedance caused by diffusion process of lithium ions inside the battery (note that a lithium battery is used in the present embodiment).

For the impedance, two different approximation models have been proposed.

A first model is a Foster type circuit for performing approximation with a sum of infinite series, and a second model is a Cauer type circuit for performing approximation by continued fraction expansion.

Both models are represented by an n-th order linear equivalent circuit.

The following explains these battery models, provided that n=3, for example.

Figure 4:
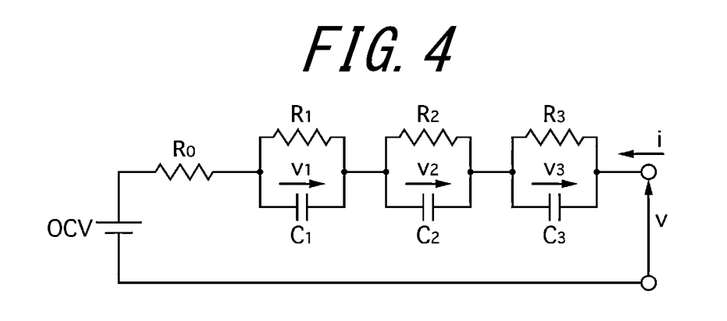
FIG. 4 is a diagram illustrating a third order Foster type battery equivalent circuit model.

First, the equivalent circuit model approximated by a third order Foster type battery equivalent circuit model is illustrated in FIG. 4. In the figure, R and C represent the resistor and the capacitor, respectively. Each subscript thereof represents an order.

When x, u, and y represent the state variable, the input, and the output, respectively,

[Equation 2]

$$x = [SOC_{v3\ v2\ v1}]^T \quad (2)$$

$$u = i \quad (3)$$

$$y = v \quad (4)$$

is satisfied.

Note that each of the v1 to the v3 represents a voltage drop in the capacitor corresponding to each subscript, and the i represents the current flowing through the entire circuit. Also, the v represents a voltage drop in the entire circuit, and the subscript T on the matrix represents its transposed matrix.

At this time, a state space satisfies:

[Equation 3]

$$\dot{x}(t) = F_f x(t) + G_f u(t) \quad (5)$$

$$y(t) = OCV(SOC) + H_f x(t) + R_0 u(t) \quad (6)$$

$$F_f = \text{diag}\left(0, -\frac{1}{C_3 R_3}, -\frac{1}{C_2 R_2}, -\frac{1}{C_1 R_1}\right) \quad (7)$$

$$G_f = \left[\frac{1}{FCC} \quad \frac{1}{C_3} \quad \frac{1}{C_2} \quad \frac{1}{C_1}\right]^T \quad (8)$$

$$H_f = [0 \quad 1 \quad 1 \quad 1] \quad (9)$$

provided that

[Equation 4]

$$C_n = \frac{C_d}{2} \quad n = 1, 2, 3 \quad (10)$$

$$R_n = \frac{8 R_d}{(2n-1)^2 \pi^2} \quad n = 1, 2, 3 \quad (11)$$

is satisfied.

Note that the above equation (5) is the state equation, and the above equation (6) is the output equation.

Figure 5:
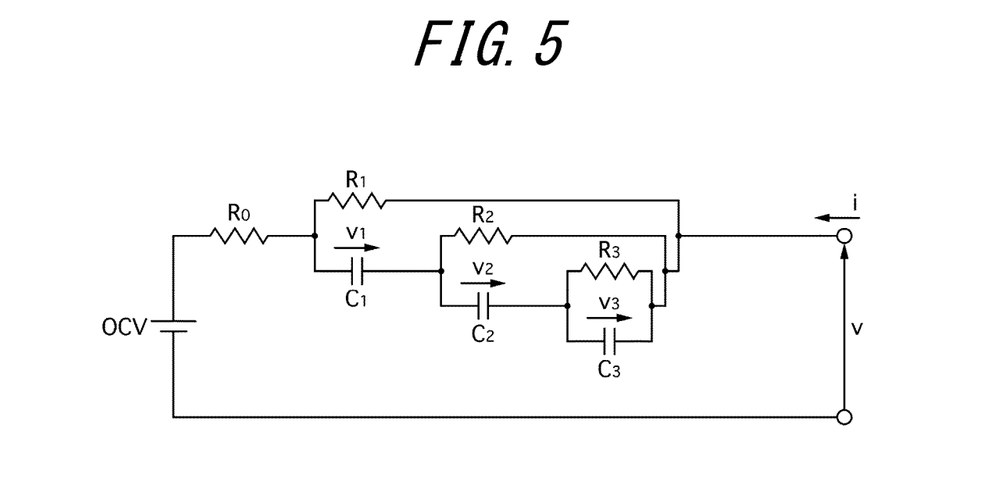
FIG. 5 is a diagram illustrating a third order Cauer type battery equivalent circuit model.

On the other hand, the equivalent circuit model approximated by a third order Cauer type circuit is shown in FIG. 5.

When x, y, and y represent the state variable, the input, and the output, respectively,

[Equation 5]

$$x = [SOC_{v3\ v2\ v1}]^T \quad (12)$$

$$u = i \quad (13)$$

$$y = v \quad (14)$$

is satisfied.

Note that each of the v1 to v3 represents the voltage drop in the capacitor corresponding to each subscript, the i represents the current flowing through the entire circuit, and the v represents the voltage drop in the entire circuit.

At this time, the state space satisfies:

[Equation 6]

$$\dot{x}(t) = F_c x(t) + G_c u(t) \quad (15)$$

$$y(t) = OCV(SOC) + H_c x(t) + R_0 u(t) \quad (16)$$

$$F_c = -\begin{bmatrix} 0 & 0 & 0 & 0 \\ 0 & \frac{1}{C_3} & \frac{1}{C_3} & \frac{1}{C_3} \\ 0 & 0 & \frac{1}{C_2} & \frac{1}{C_2} \\ 0 & 0 & 0 & \frac{1}{C_1} \end{bmatrix} \begin{bmatrix} 0 & 0 & 0 & 0 \\ 0 & \frac{1}{R_3} & 0 & 0 \\ 0 & \frac{1}{R_2} & \frac{1}{R_2} & 0 \\ 0 & \frac{1}{R_1} & \frac{1}{R_1} & \frac{1}{R_1} \end{bmatrix} \quad (17)$$

$$G_c = \begin{bmatrix} \frac{1}{FCC} & \frac{1}{C_3} & \frac{1}{C_2} & \frac{1}{C_1} \end{bmatrix}^T \quad (18)$$

$$H_c = [\,0\ 1\ 1\ 1\,] \quad (19)$$

provided that

[Equation 7]

$$C_n = \frac{C_d}{4n-1} \quad n = 1, 2, 3 \quad (20)$$

$$R_n = \frac{R_d}{4n-3} \quad n = 1, 2, 3 \quad (21)$$

is satisfied.

Note that the above equation (15) is the state equation, and the equation (16) is the output equation.

Next, the Foster type battery equivalent circuit model and the Cauer type battery equivalent circuit model are used for simultaneous estimation of a battery state and the parameter by the Kalman filter.

Although an unscented Kalman filter (UKF: Unscented Kalman Filter) is used here, a Kalman filter of a different type may be used.

The UKF approximates a probability distribution by using a weighted sample point referred to as a sigma point and thereby calculates each weighted transition. In particular, a mean value and variance after transition at each sigma point are calculated and added according to the weight.

In this way, the probability distribution after the transition may be further approximated to a true value, while preventing an excessive increase in a calculation amount. Also, since the probability distribution is approximated by using the sigma point instead of approximation of the system, there is no restriction on non-linearity of the system.

Here, in order to clarify characteristics of the method of the present invention by comparing the method of the present invention to other methods, the following three application methods were attempted.

A first method estimates the parameter as it stands, a second method estimates a normalized parameter, and a third method is the method of the present invention that estimates the logarithmic conversion parameter value.

First, the first method of estimating the parameter as it stands will be described The Foster type battery equivalent circuit model and the Cauer type battery equivalent circuit model are rewritten to expansion models capable of simultaneously estimating the parameter and the open-circuit voltage.

That is, as an expansion state variable and an output,

[Equation 8]

$$z = [SOC_{v3\ v2\ v1}\ R_0\ R_d\ C_d\ i]^T \quad (22)$$

$$y = [v\ i]^T \quad (23)$$

is newly defined.

Here, note that the current i as well as the parameters $R_0$, $R_d$, and $C_d$ are used as the state variables.

At this time, the Foster type battery equivalent circuit model satisfies:

[Equation 9]

$$\dot{z}(t) = f_f(z(t)) \quad (24)$$

$$y(t) = h_f(z(t)) \quad (25)$$

provided that

[Equation 10]

$$f_f(z(t)) = \begin{bmatrix} \dfrac{i}{FCC} \\ -\dfrac{25\pi^2 v_3}{4C_d R_d} + \dfrac{2i}{C_d} \\ -\dfrac{9\pi^2 v_2}{4C_d R_d} + \dfrac{2i}{C_d} \\ -\dfrac{\pi^2 v_1}{4C_d R_d} + \dfrac{2i}{C_d} \\ 0 \\ 0 \\ 0 \\ 0 \end{bmatrix} \quad (26)$$

$$h_f(z(t)) = \begin{bmatrix} OCV(SOC) + v_3 + v_2 + v_1 + R_0 i \\ i \end{bmatrix} \quad (27)$$

is satisfied.

Also, the Cauer type battery equivalent circuit model satisfies:

[Equation 11]

$$f_f(z(t)) = \begin{bmatrix} \dfrac{i}{FCC} \\ -\dfrac{25\pi^2 v_3}{4C_d R_d} + \dfrac{2i}{C_d} \\ -\dfrac{9\pi^2 v_2}{4C_d R_d} + \dfrac{2i}{C_d} \\ -\dfrac{\pi^2 v_1}{4C_d R_d} + \dfrac{2i}{C_d} \\ 0 \\ 0 \\ 0 \\ 0 \end{bmatrix} \quad (26)$$

$$h_f(z(t)) = \begin{bmatrix} OCV(SOC) + v_3 + v_2 + v_1 + R_0 i \\ i \end{bmatrix} \quad (27)$$

provided that

[Equation 12]

$$f_c(z(t)) = \begin{bmatrix} \frac{i}{FCC} \\ -\frac{165v_3 + 66v_2 + 11v_1}{C_d R_d} + \frac{11i}{C_d} \\ -\frac{42v_3 + 42v_2 + 7v_1}{C_d R_d} + \frac{7i}{C_d} \\ -\frac{3v_3 + 3v_2 + 3v_1}{C_d R_d} + \frac{3i}{C_d} \\ 0 \\ 0 \\ 0 \\ 0 \end{bmatrix} \quad (30)$$

$$h_c(z(t)) = \begin{bmatrix} OCV(SOC) + v_3 + v_2 + v_1 + R_0 i \\ i \end{bmatrix} \quad (31)$$

is satisfied.

The expansion models as described above are discretized by using Euler's method, Runge-Kutta method, or the like, and estimated by using the UKF.

Next, the second method, i.e., the method of estimating the normalized parameter will be described.

In a case where the parameter is estimated as it stands as described above, a great difference in the orders of the parameters causes a problem in accuracy of numerical calculation by a computer. In this case, since the orders are as follows: $R_0$ is $10^{-4}$, $R_d$ is $10^{-4}$, and $C_d$ is $10^5$, in the process of cancellation of the Kalman gain of the UKF, cancellation of significant digits occurs.

In order to solve the above problem, therefore, a normalized UKF is applied here.

The normalized UKF converts state variables with different orders into state variables with uniform orders and estimates such new state variables.

That is, a new state variable $z_N$ with uniform orders with respect to the state variable z of the equation (22) is represented by:

[Equation 13]

$$z_N = [SOC_{v3\ v2\ v1}\ R'_0\ R'_d\ C'_d\ i]^T \quad (32)$$

and thus estimated.

Note that the $N_{R0}$, the $N_{Rd}$, and the $N_{Cd}$ are normalized factors represented by:

[Equation 14]

$$R'_0 = N_{R_0} R_0\ R'_d = N_{R_d} R_d\ C'_d = N_{C_d} C_d \quad (33)$$

In this case, the normalized factors are, for example:

[Equation 15]

$$N_{R_0} = 10^4\ N_{R_d} = 10^4\ N_{C_d} = 10^{-5} \quad (34)$$

When the output remains as the equation (23), the equivalent circuit models of the Foster type (equations (24) and (25)) satisfy:

[Equation 16]

$$\dot{z}_N(t) = f_{fN}(z_N(t)) \quad (35)$$

$$y(t) = h_{fN}(z_N(t)) \quad (36)$$

provided that

[Equation 17]

$$f_{fN}(z_N(t)) = \begin{bmatrix} \frac{i}{FCC} \\ -\frac{25\pi^2 N_{R_d} N_{C_d} v_3}{4C'_d R'_d} + \frac{2N_{C_d} i}{C'_d} \\ -\frac{9\pi^2 N_{R_d} N_{C_d} v_2}{4C'_d R'_d} + \frac{2N_{C_d} i}{C'_d} \\ -\frac{\pi^2 N_{R_d} N_{C_d} v_1}{4C'_d R'_d} + \frac{2N_{C_d} i}{C'_d} \\ 0 \\ 0 \\ 0 \\ 0 \end{bmatrix} \quad (37)$$

$$h_{fN}(z_N(t)) = \begin{bmatrix} OCV(SOC) + v_3 + v_2 + v_1 + \frac{R'_0}{N_{R_0}} i \\ i \end{bmatrix} \quad (38)$$

is satisfied.

Note that the Cauer type battery equivalent circuit model (equations (28) and (29)) may be rewritten in a similar manner.

Next, the present invention, i.e., the method of estimating the logarithmic conversion parameter value used in Embodiment 1 will be described.

Taking the logarithm of the parameter allows, similarly to the normalized parameter described above, uniformity of the order of the parameters to be estimated.

In this method, the Kalman filter estimates, instead of a state variable X, an exponent Z thereof.

That is, with a Napier number as a base, Z represented by:

[Equation 18]

$$X = \exp Z \quad (39)$$

is estimated.

With reference to the state variable z in the equation (22), a state variable $z_L$ that takes a natural logarithm of the parameter is represented by:

[Equation 19]

$$z_L = [SOC_{v3\ v2\ v1}\ R''_0\ R''_d\ C''_d\ i]^T \quad (40)$$

and thus estimated, provided that

[Equation 20]

$$R''_0 = \ln R_0\ R''_d = \ln R_d\ C''_d = \ln C_d \quad (41)$$

is satisfied.

Note that, although the natural logarithm is used here, a logarithm with any positive real number other than 1 as the base may be used.

When the output remains as the equation (23), the expansion models (the equations (24) and (25)) of the Foster type battery equivalent circuit model is represented by:

[Equation 21]

$$\dot{z}_L(t) = f_{fL}(z_L(t)) \quad (42)$$

$$y(t) = h_{fL}(z_L(t)) \quad (43)$$

provided that

[Equation 22]

$$f_{fL}(z_L(t)) = \begin{bmatrix} \dfrac{i}{FCC} \\ -\dfrac{25\pi^2 v_3}{4\exp(C_d'' R_d'')} + \dfrac{2i}{\exp(C_d'')} \\ -\dfrac{9\pi^2 v_2}{4\exp(C_d'' R_d'')} + \dfrac{2i}{\exp(C_d'')} \\ -\dfrac{\pi^2 v_1}{4\exp(C_d'' R_d'')} + \dfrac{2i}{\exp(C_d'')} \\ 0 \\ 0 \\ 0 \\ 0 \end{bmatrix} \quad (44)$$

$$h_{fL}(z_L(t)) = \begin{bmatrix} OCV(SOC) + v_3 + v_2 + v_1 + \exp(R_0'')i \\ i \end{bmatrix} \quad (45)$$

is satisfied.

Note that the Cauer type battery equivalent circuit model (equations (28) and (29)) may be rewritten in a similar manner.

As described above, the parameter and the open-circuit voltage of the battery equivalent circuit model may be sequentially and simultaneously estimated by the Kalman filter.

The following is a description of results of simulations of the three methods described above carried out by using actual driving data of the electric vehicle.

Figure 6:
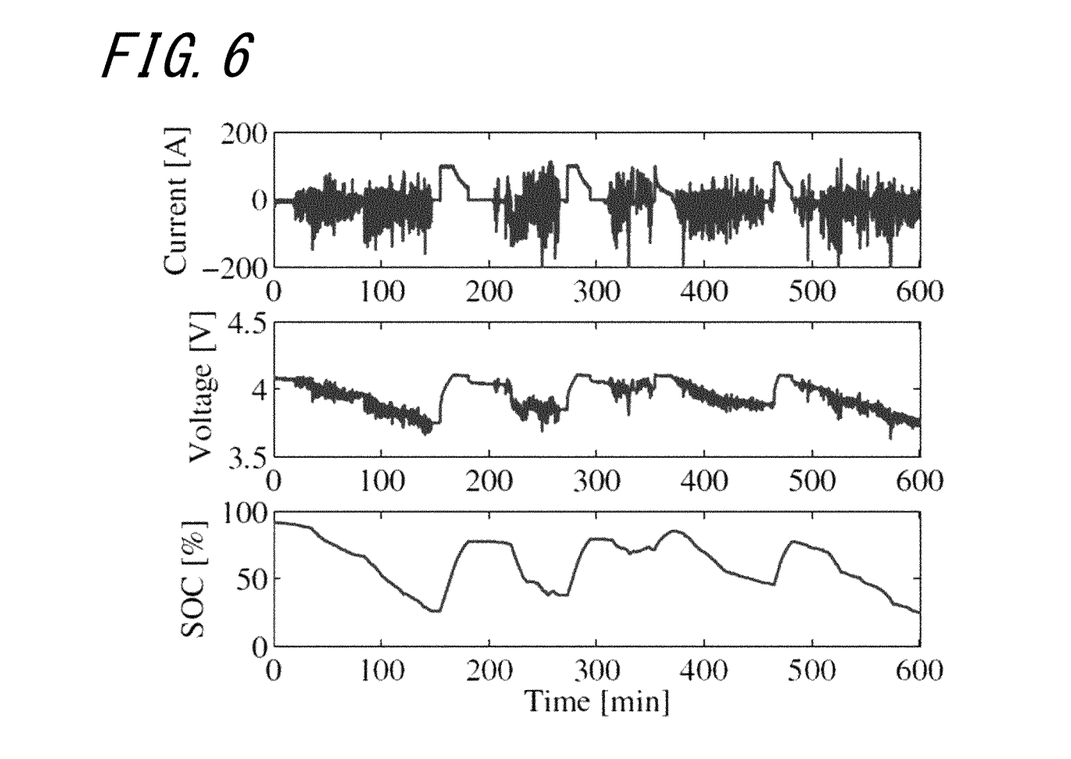
FIG. 6 is a diagram illustrating measurement data of a current, a voltage, and a state of charge when an electric vehicle is driven in practice.

FIG. 6 illustrates measurement data of the current, the voltage, and the state of charge obtained when the electric vehicle is driven in practice. The data of the current and the voltage are used without changing, and the parameter and the state of charge are estimated simultaneously.

The following six estimation methods were compared with one another.

First, by using the third order Forster type battery equivalent circuit model, the following three different simulations were conducted.

Figure 7:
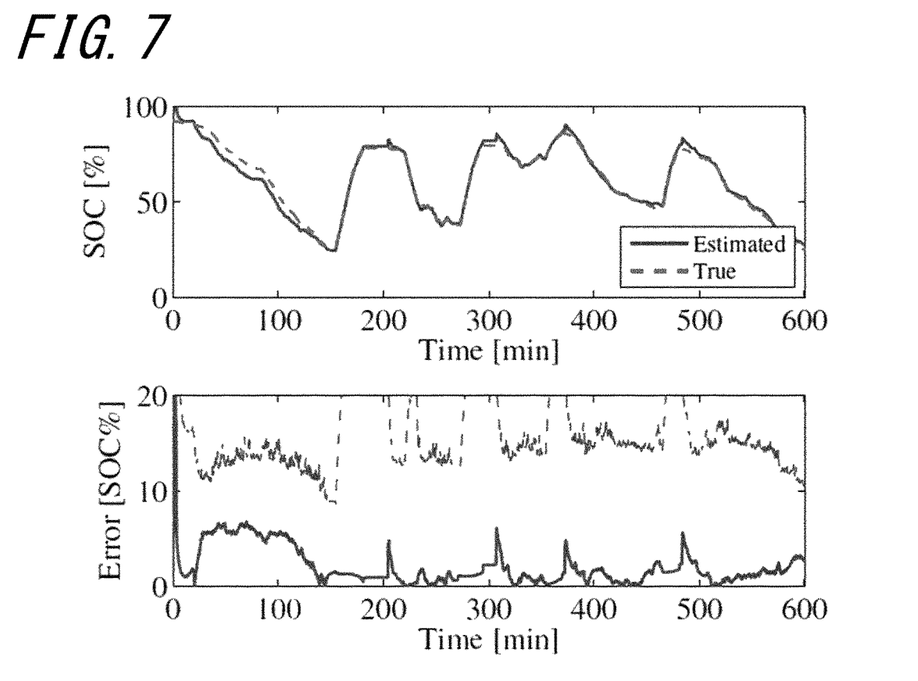
FIG. 7 is a diagram illustrating an estimated state of charge and its error as a result of simultaneous estimation made by a normal Kalman filter when the third order Foster type battery equivalent circuit model is used.
Figure 8:
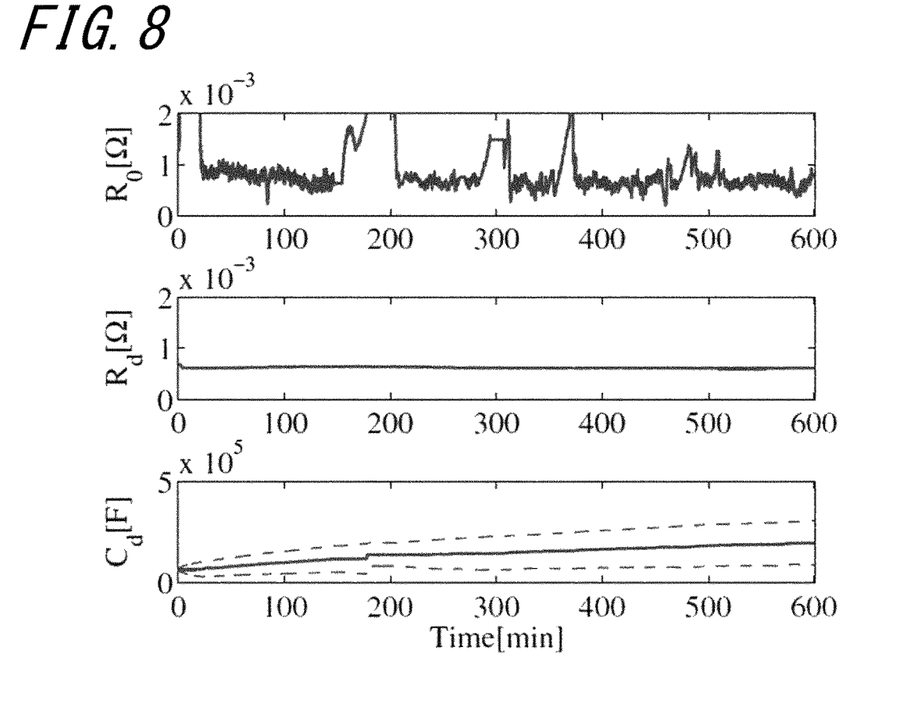
FIG. 8 is a diagram illustrating an estimated parameter value of FIG. 7.

(Simulation 1) Results of the simultaneous estimation by a normal UKF are illustrated in FIG. 7 (an upper graph indicates a relation among an elapsed time, the estimated state of charge, and the true value, and a lower graph indicates a relation between the elapsed time and an error of the state of charge) and in FIG. 8 (illustrating changes in the parameters $R_0$, $R_d$, and $C_d$ with respect to the elapsed time).

Figure 9:
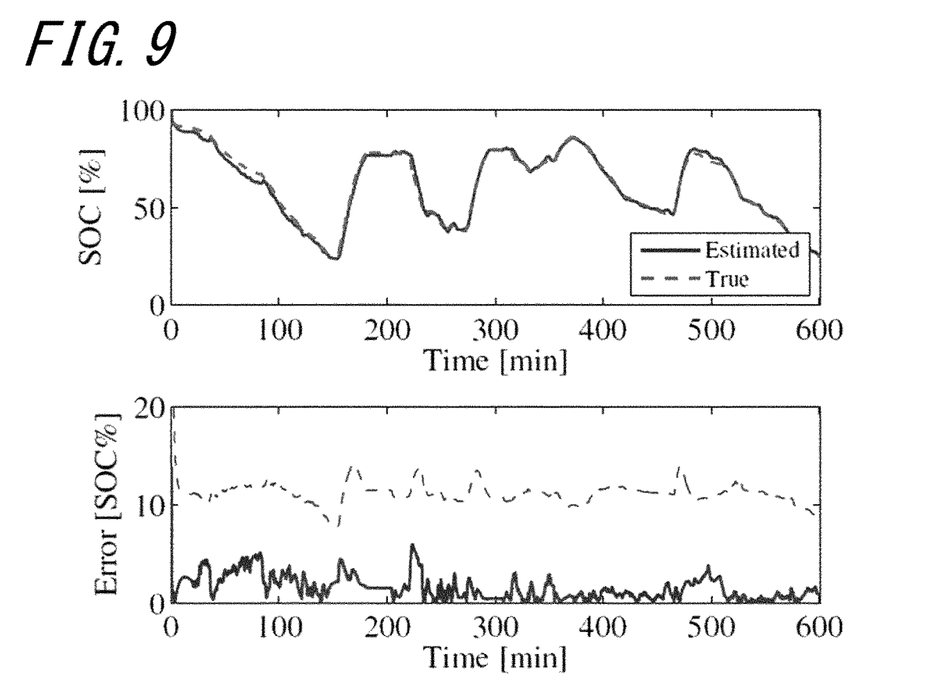
FIG. 9 is a diagram illustrating an estimated state of charge and its error as a result of simultaneous estimation made by a normalized Kalman filter when the third order Foster type battery equivalent circuit model is used.
Figure 10:
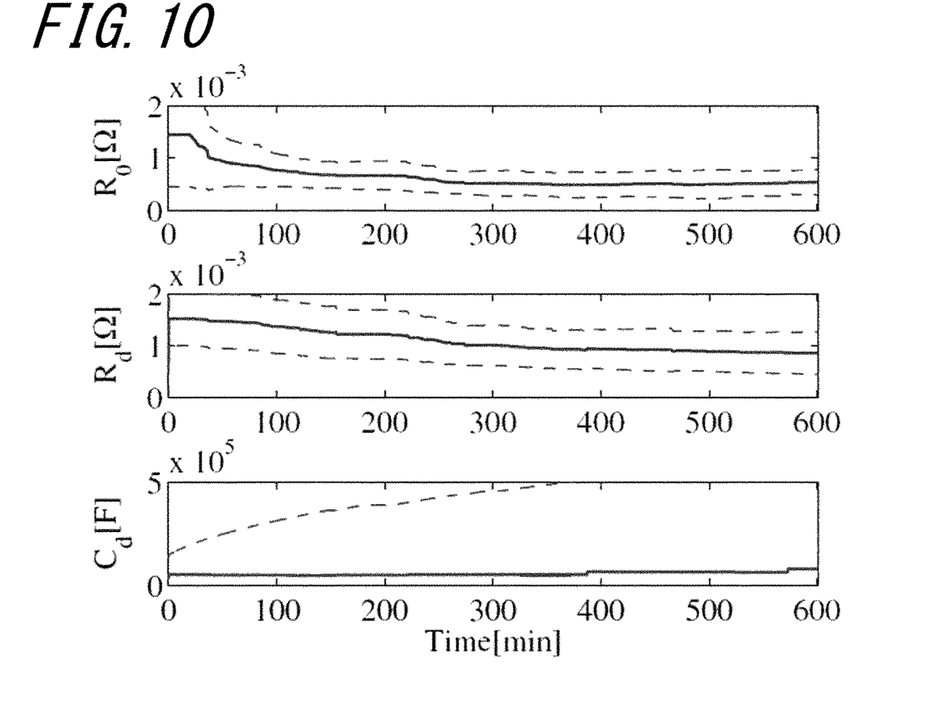
FIG. 10 is a diagram illustrating an estimated parameter value of FIG. 9.

(Simulation 2) Results of the simultaneous estimation by the normalized UKF are illustrated in FIG. 9 (an upper graph indicates the relation among the elapsed time, the estimated state of charge, and the true value, and a lower graph indicates the relation between the elapsed time and the error of the state of charge) and in FIG. 10 (illustrating changes in the parameters $R_0$, $R_d$, and $C_d$ with respect to the elapsed time).

Figure 11:
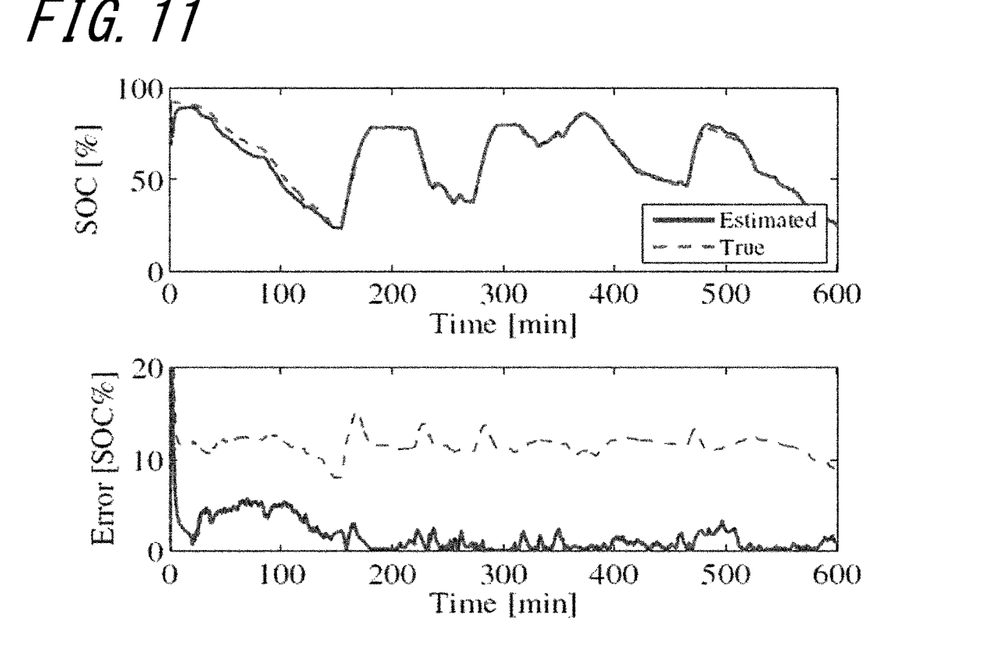
FIG. 11 is a diagram illustrating an estimated state of charge and its error as a result of simultaneous estimation made by a Kalman filter employing logarithmic conversion when the third order Foster type battery equivalent circuit model is used.
Figure 12:
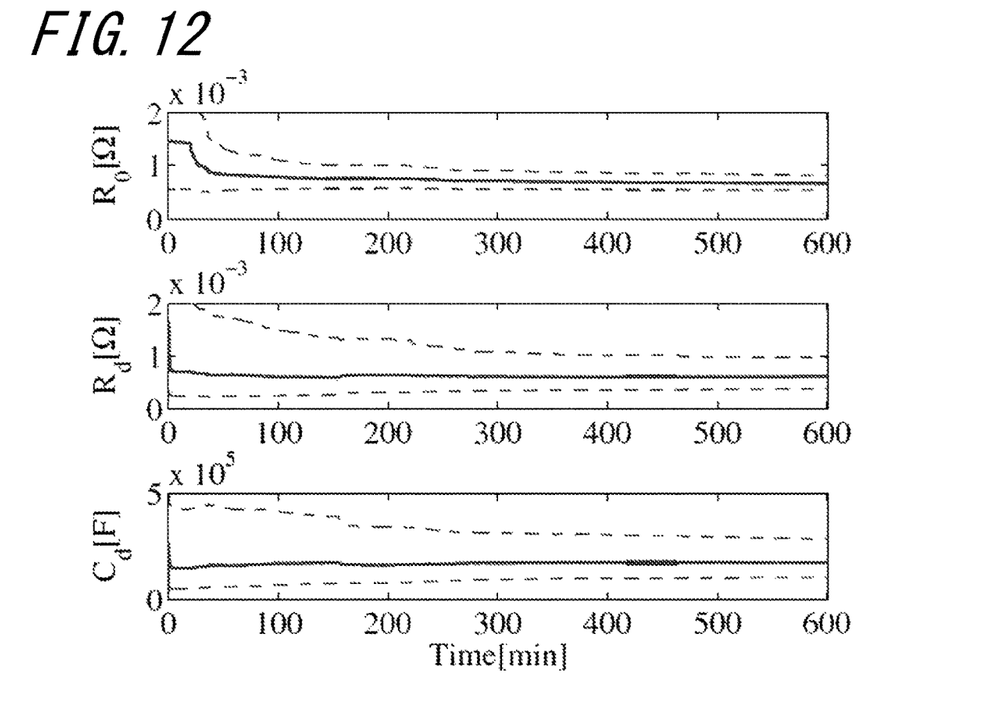
FIG. 12 is a diagram illustrating an estimated parameter value of FIG. 11.

(Simulation 3) Results of the simultaneous estimation by the UKF using the logarithmic conversion are illustrated in FIG. 11 (an upper graph indicates the relation among the elapsed time, the estimated state of charge, and the true value, and a lower graph indicates the relation between the elapsed time and the error of the state of charge) and in FIG. 12 (illustrating changes in the parameters $R_0$, $R_d$, and $C_d$ with respect to the elapsed time).

Next, by using the third order Cauer type battery equivalent circuit model, the following three different simulations were conducted.

Figure 13:
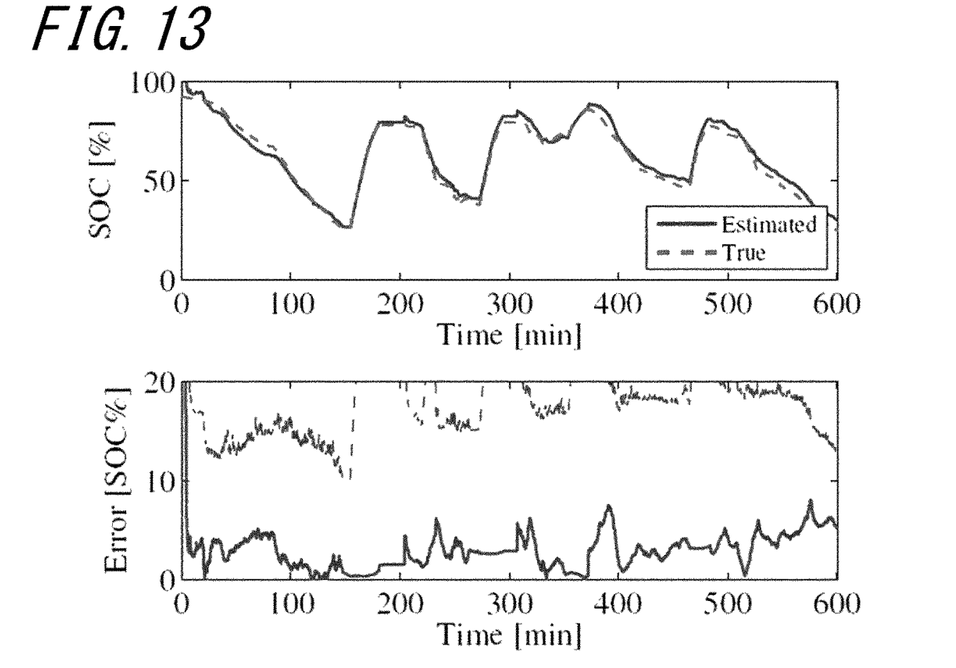
FIG. 13 is a diagram illustrating an estimated state of charge and its error as a result of simultaneous estimation made by the normal Kalman filter when the third order Cauer type battery equivalent circuit model is used.
Figure 14:
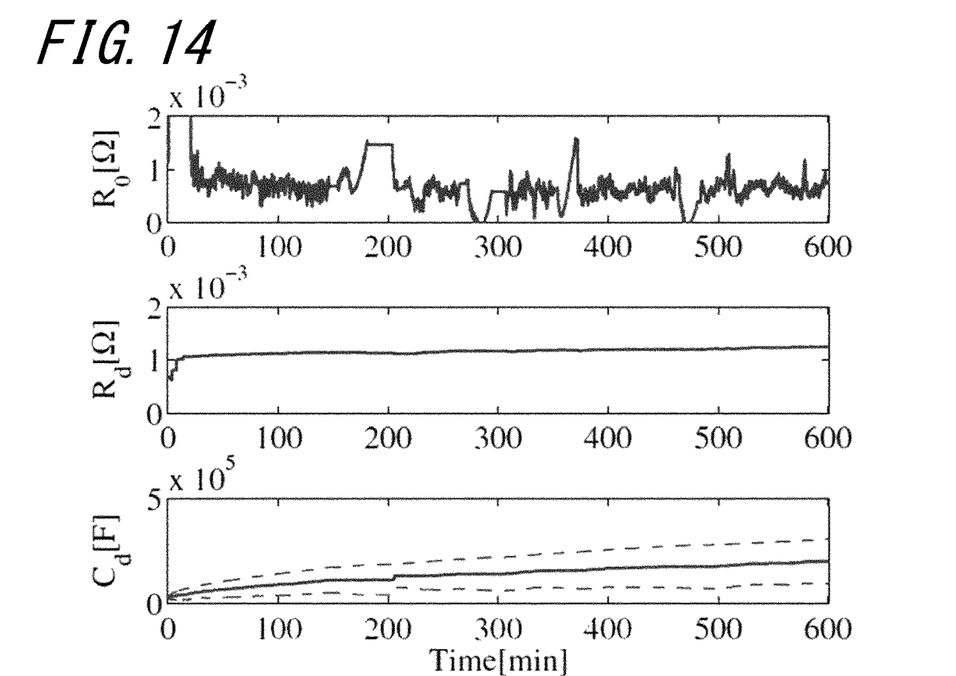
FIG. 14 a diagram illustrating an estimated parameter value of FIG. 13.

(Simulation 4) Results of the simultaneous estimation by the UKF are illustrated in FIG. 13 (an upper graph indicates the relation among the elapsed time, the estimated state of charge, and the true value, and a lower graph indicates the relation between the elapsed time and the error of the state of charge) and in FIG. 14 (illustrating changes in the parameters $R_0$, $R_d$, and $C_d$ with respect to the elapsed time).

Figure 15:
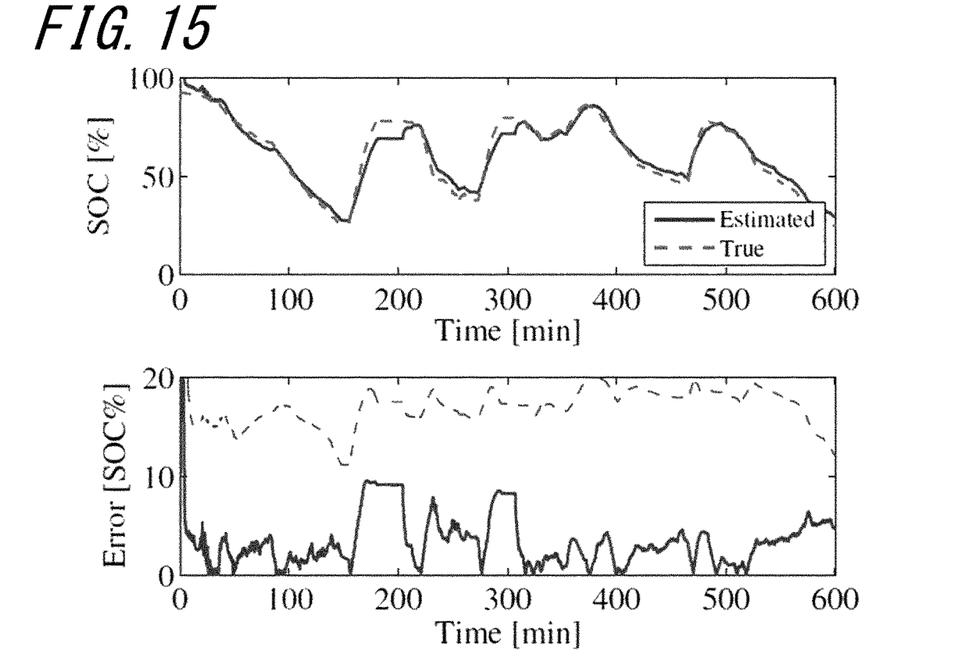
FIG. 15 is a diagram illustrating an estimated state of charge and its error as a result of simultaneous estimation made by the normalized Kalman filter when the third order Cauer type battery equivalent circuit model is used.
Figure 16:
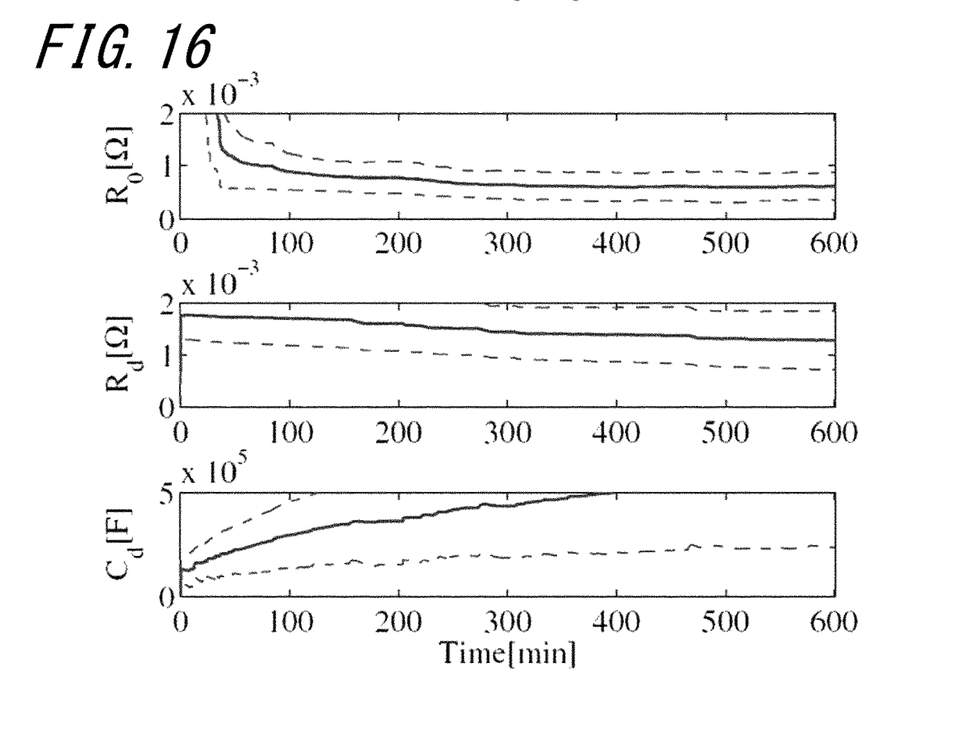
FIG. 16 is a diagram illustrating an estimated parameter value of FIG. 15.

(Simulation 5) Results of the simultaneous estimation by the normalized UKF are illustrated in FIG. 15 (an upper graph indicates the relation among the elapsed time, the estimated state of charge, and the true value, and a lower graph indicates the relation between the elapsed time and the error of the state of charge) and in FIG. 16 (illustrating changes in the parameters $R_0$, $R_d$, and $C_d$ with respect to the elapsed time).

Figure 17:
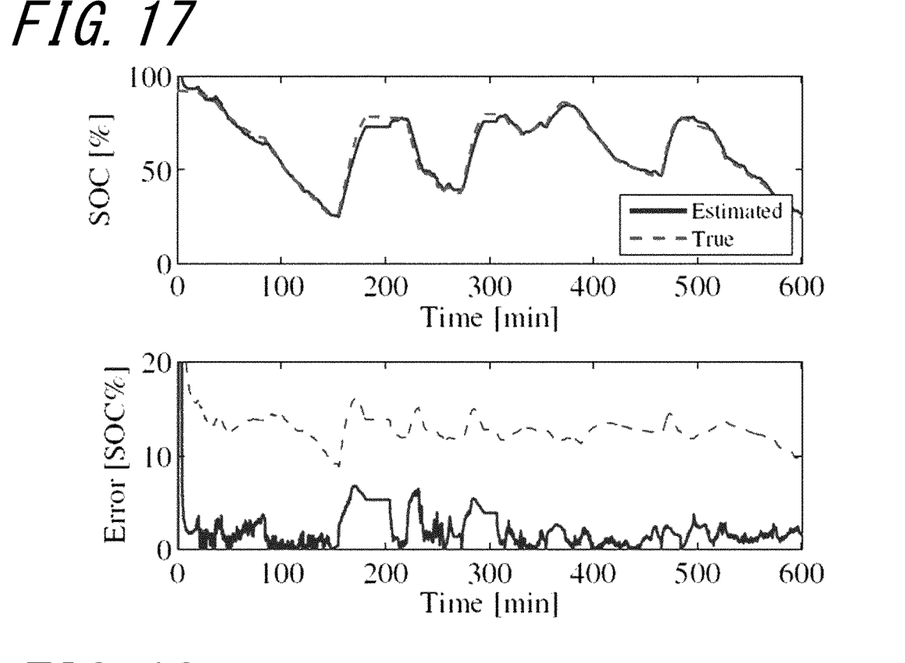
FIG. 17 is a diagram illustrating an estimated state of charge and its error as a result of simultaneous estimation made by the Kalman filter employing logarithmic conversion when the third order Cauer type battery equivalent circuit model is used.
Figure 18:
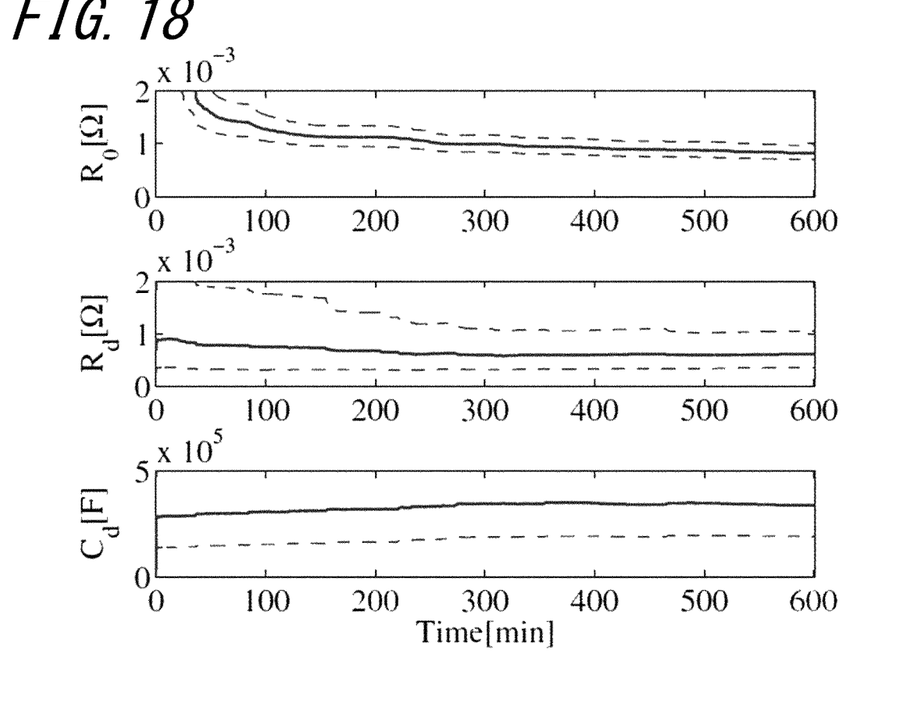
FIG. 18 a diagram illustrating an estimated parameter value of FIG. 17.

(Simulation 6) Results of the simultaneous estimation by the UKF using the logarithmic conversion are illustrated in FIG. 17 (an upper graph indicates the relation among the elapsed time, the estimated state of charge, and the true value, and a lower graph indicates the relation between the elapsed time and the error of the state of charge) and in FIG. 18 (illustrating changes in the parameters $R_0$, $R_d$, and $C_d$ with respect to the elapsed time).

The following facts may be seen from the above results and simulation results of other driving patterns.

First, regarding estimation accuracy of the state of charge, there is no much difference among the state of charges estimated in the above three methods. Regarding average estimation accuracy of the state of charge, however, the UKF using the logarithmic conversion is approximately the same as, or slightly better than, the normalized UKF and better than the normal UKF. Especially when the normal UKF is used, large spike-like errors occurred in places, which are the causes of a reduction in the estimation accuracy.

Regarding estimation accuracy of the parameters, as is apparent from the above results, the UKF using the logarithmic conversion has the best estimation accuracy, followed by the normalized UKF and then the normal UKF.

However, since the true value of the parameter is unknown, the validity of the estimated value is determined with an estimated variance value.

That is, when a range of 1σ indicated by broken lines in FIG. 10, FIG. 12, FIG. 14, FIG. 16, and FIG. 18 becomes narrow enough, the estimation accuracy is high. On the other hand, when the range of 1σ indicated by the broken line expands, the estimation accuracy is not very reliable.

For example, in FIG. 18 illustrating the results of the UKF using the logarithmic conversion, the ranges of 1σ of all parameters narrow. On the other hand, in FIG. 16 illustrating the results of the normalized UKF, the range of 1σ of a diffusion capacitance $C_d$ expands. Also, in FIG. 14 illustrating the results of the normal UKF, the ranges of 1σ of the $R_0$ and the $R_d$ expand too much to fit in the figure, and the range of 1σ of the $C_d$ expands.

From the comparison of the results of the Foster type and the Cauer type, it can be seen that the Foster type has a higher estimation accuracy of the state of charge than the Foster type, in general. The Cauer type may cause a large error especially at the time of charging. This is considered to be caused by a complicated difference between the equation (24) and the equation (28).

Here, the present invention, i.e., the estimation of the parameter subjected to the logarithmic conversion by the Kalman filter will be further described.

Assuming that the parameter forms the normal distribution as conventionally assumed, a range of the estimated parameter value (such as the resistance) expands or narrows during the estimation. As a result, the parameter takes an unpractical negative value when the range expands, causing a reduction in the estimation accuracy.

On the other hand, the present embodiment is as follows:

Estimation of the parameter subjected to the logarithmic conversion means estimation of, instead of the state variable X, the exponent thereof, i.e., Z represented by

[Equation 23]

$$X = \exp Z \quad (46)$$

The UKF using the logarithmic conversion estimates the value assuming that the exponent Z has white noise added thereto.

Under this assumption, the original state variable X follows a logarithmic normal distribution instead of the normal distribution.

Thereby, the parameters $R_0$, $R_d$, and $C_d$ of the battery are considered to be well satisfying the above assumption.

For example, a diffusion resistance $R_d$ of the battery is represented by:

[Equation 24]

$$R_d(T) \propto \frac{1}{D(T)} = \frac{1}{D_0} \exp\left(\frac{E_a}{RT}\right) \quad (47)$$

provided that the T represents absolute temperature, the D represents a diffusion coefficient, the $D_0$ represents a constant, the $E_a$ represents activation energy, and the R represents a gas constant.

In this case, due to ununiformity of a state in the vicinity of an electrode surface, the absolute temperature T and the activation energy $E_a$ may vary. Assuming such variations form the normal distribution, the original diffusion resistance $R_d$ forms a logarithmic normal distribution.

Although the above discussion may not be theoretically perfect, an obtained value is closer to an actual value at least than a value obtained by assuming that the parameter of the battery form the normal distribution as conventionally assumed. Also, the parameter such as the resistance is prevented from taking an unpractical negative value. Therefore, the parameter and an estimated value of the internal state using the parameter may be accurately estimated.

As described above, the battery parameter estimation device and the estimation method of the battery parameter according to Embodiment 1 includes: the logarithmic conversion parameter value estimation unit 4B for sequentially estimating, by using the logarithmic conversion parameter value serving as the state variable obtained by carrying out the logarithmic conversion on the parameter of the battery equivalent circuit model 4A of the battery 1, the logarithmic conversion parameter value with the Kalman filter 41 from the state equation and the output equation based on the charging/discharging current i and the terminal voltage v those being detected; and the inverse logarithmic conversion unit 4C for obtaining, by carrying out the inverse logarithmic conversion on the logarithmic conversion parameter value, the parameter serving as the true value corresponding to the logarithmic conversion parameter value. Therefore, the estimation accuracy of the parameter is higher than the conventional techniques. Also, the estimated parameter is prevented from taking an unpractical negative value, thus improving the estimation accuracy.

Further, since the estimation accuracy of the parameter may be improved, the internal state (the state of charge, the state of health and the like) of the battery 1 may also be estimated highly accurately.

Although the present invention has been described based on the embodiment, it is to be understood that the present invention is not limited thereto but includes different configurations made within the scope of the present invention.

For example, the battery parameter estimation device according to the present invention may be used for the estimation of the internal state of the battery of the electric vehicle and a hybrid vehicle, as well as for the estimation of an internal state of a battery used in other apparatuses or systems.

REFERENCE SIGNS LIST 1 battery
2 voltage sensor (terminal voltage detection unit)
3 current sensor (charging/discharging current detection unit)
4 state estimation unit
4A battery equivalent circuit model
4B logarithmic conversion parameter value estimation unit
4C inverse logarithmic conversion unit
41 Kalman filter
5 charge amount calculation unit
6 state of charge calculation unit
7 state of health calculation unit

The invention claimed is:

1. A device for estimating parameters of battery including:
a micro-computer,
a current sensor connected to the battery and the micro-computer for detecting a charging/discharging current of a battery, and
a voltage sensor connected to the battery and the micro-computer for detecting a terminal voltage of the battery,
wherein the micro-computer comprises:
a battery equivalent circuit model including a plurality of resistors and a plurality of capacitors each serving as a factor;
a unit configured to sequently estimate a logarithmic conversion parameter value obtained by carrying out logarithmic conversion on each factor of the battery equivalent circuit, based on the charging/discharging current and the terminal voltage those being detected; and
an inverse logarithmic conversion unit for obtaining, by carrying out inverse logarithmic conversion on the logarithmic conversion parameter value an antilogarithm corresponding to the logarithmic conversion parameter value,
wherein the logarithmic conversion parameter value estimation unit includes a Kalman filter to sequentially estimate the logarithmic conversion parameter value,
wherein the logarithmic conversion parameter value is calculated from a state equation and an output equation, and
wherein the antilogarithm obtained by the inverse logarithmic conversion unit is used as an estimated parameter value of each factor of the battery equivalent circuit.

2. The device for estimating parameters of battery according to claim 1, wherein the micro-computer further comprises a unit configured to estimate an internal state value of the battery based on the estimated parameter value obtained by the inverse logarithmic conversion unit.

3. The device for estimating parameters of battery according to claim 2, wherein
the internal state value is at least one of a state of charge and a state of health of the battery.

4. A method for estimating parameter values of a battery equivalent circuit model including a plurality of resistors and a plurality of capacitors each serving as a factor, the method comprising:
detecting a charging/discharging current and a terminal voltage of the battery;
sequentially estimating a logarithmic conversion parameter value obtained by carrying out logarithmic conversion on each factor of the battery equivalent circuit based on the charging/discharging current and the terminal voltage those being detected; and
obtaining an antilogarithm corresponding to the logarithmic conversion parameter value by carrying out inverse logarithmic conversion on the logarithmic conversion parameter value,
wherein a Kalman filter is used to sequentially estimate the logarithmic conversion parameter value,
wherein the logarithmic conversion parameter value is calculated from a state equation and an output equation, and
wherein the antilogarithm is used as an estimated parameter value of each factor of the battery equivalent circuit.

5. The method according to claim 4, wherein
an internal state value of the battery is estimated based on the estimated parameter value serving as the antilogarithm obtained by carrying out the inverse logarithmic conversion.

6. The method according to claim 5, wherein
the internal state value is at least one of a state of charge and a state of health of the battery.

* * * * *